US010468054B1

(12) United States Patent
Shin et al.

(10) Patent No.: US 10,468,054 B1
(45) Date of Patent: Nov. 5, 2019

(54) WRITE HEAD HAVING A MONOLITHIC SIDE SHEILD AND LEADING SHIELD

(71) Applicant: Western Digital Technologies, Inc., San Jose, CA (US)

(72) Inventors: Kyusik Shin, Pleasanton, CA (US); Yingjian Chen, Fremont, CA (US); Jennifer Leung, San Jose, CA (US); Munhyoun Park, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/109,489

(22) Filed: Aug. 22, 2018

(51) Int. Cl.
| | |
|---|---|
| *G11B 5/11* | (2006.01) |
| *G11B 5/127* | (2006.01) |
| *G11B 5/31* | (2006.01) |
| *C23C 16/455* | (2006.01) |
| *C23C 16/40* | (2006.01) |
| *C23C 16/06* | (2006.01) |
| *G11B 5/23* | (2006.01) |

(52) U.S. Cl.
CPC ............ *G11B 5/11* (2013.01); *C23C 16/06* (2013.01); *C23C 16/403* (2013.01); *C23C 16/45525* (2013.01); *G11B 5/1278* (2013.01); *G11B 5/232* (2013.01); *G11B 5/315* (2013.01); *G11B 5/3116* (2013.01); *G11B 5/3163* (2013.01)

(58) Field of Classification Search
CPC ......... G11B 5/11; G11B 5/1278; G11B 5/232; G11B 5/3116; G11B 5/315; G11B 5/3163

USPC ................... 360/125.1–125.7, 125.3–125.35
See application file for complete search history.

(56) References Cited

U.S. PATENT DOCUMENTS

| | | | |
|---|---|---|---|
| 7,251,878 B2 | 8/2007 | Le et al. | |
| 7,898,773 B2 * | 3/2011 | Han .......................... | G11B 5/11 360/125.09 |
| 8,295,008 B1 * | 10/2012 | Sasaki .................. | G11B 5/1278 360/125.02 |
| 8,508,886 B2 | 8/2013 | Chen et al. | |

(Continued)

OTHER PUBLICATIONS

Chatradhi, et al.; Western Digital; Technology Brief; Next-Generation Technologies for a New Decade of Big Data; Building on a Foundation of Technology Leadership, Timely Investments and Proven Execution; dated Oct. 11, 2017; 12 total pages.

*Primary Examiner* — Allen T Cao
(74) *Attorney, Agent, or Firm* — Patterson & Sheridan, LLP; Steven H. Versteeg

(57) ABSTRACT

Embodiments of the present disclosure generally relate to data storage devices, and more specifically, to a magnetic media drive employing a write head. The write head comprises a main pole and a monolithic side shield. A first leading shield is disposed below the side shield, and a second leading shield is disposed between the first leading shield and the side shield. The first leading shield has a greater throat height than a throat height of the second leading shield. A side shield throat height extending from the main pole to the side shield is shorter than the first leading shield throat height extending from the main pole to the first leading shield. The varying throat heights between the main pole, the side shield, and the first leading shield allow for enhanced cross-track recording density and reduce flux leakage from the main pole.

32 Claims, 7 Drawing Sheets

(56) References Cited

U.S. PATENT DOCUMENTS

| | | | | |
|---|---|---|---|---|
| 8,533,937 B1* | 9/2013 | Wang | ..................... | H04R 31/00 |
| | | | | 216/22 |
| 8,724,259 B1* | 5/2014 | Liu | ..................... | G11B 5/1278 |
| | | | | 360/125.15 |
| 8,767,347 B1* | 7/2014 | Sasaki | ................... | G11B 5/315 |
| | | | | 360/123.06 |
| 8,914,969 B1* | 12/2014 | Zhou | ..................... | G11B 5/315 |
| | | | | 216/22 |
| 8,953,284 B1* | 2/2015 | Mashima | ............. | G11B 5/3948 |
| | | | | 360/314 |
| 9,214,166 B1 | 12/2015 | Zeng et al. | | |
| 9,218,824 B2 | 12/2015 | Linville et al. | | |
| 9,230,566 B1* | 1/2016 | Iwakura | ................... | G11B 5/11 |
| 9,361,912 B1* | 6/2016 | Liu | ...................... | G11B 5/187 |
| 9,466,319 B1* | 10/2016 | Tang | ..................... | G11B 5/1278 |
| 9,472,214 B1* | 10/2016 | Cao | ....................... | G11B 5/3903 |
| 9,489,969 B1* | 11/2016 | Ikegawa | ................. | G11B 5/315 |
| 9,653,101 B1* | 5/2017 | Liu | ...................... | G11B 5/3116 |
| 9,721,604 B2 | 8/2017 | Tang et al. | | |
| 2012/0125885 A1* | 5/2012 | Chen | ................... | G11B 5/1278 |
| | | | | 216/22 |
| 2012/0218663 A1* | 8/2012 | Sasaki | ................. | G11B 5/1278 |
| | | | | 360/123.12 |
| 2012/0236431 A1* | 9/2012 | Hirata | ................... | G11B 5/012 |
| | | | | 360/70 |
| 2015/0116869 A1* | 4/2015 | Aoyama | ................. | G11B 5/39 |
| | | | | 360/319 |
| 2016/0343391 A1* | 11/2016 | Sasaki | ................... | G11B 5/315 |
| 2017/0040031 A1* | 2/2017 | Tang | ..................... | G11B 5/3116 |

\* cited by examiner

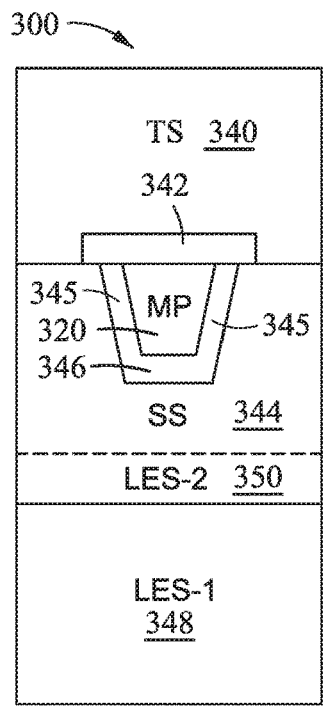
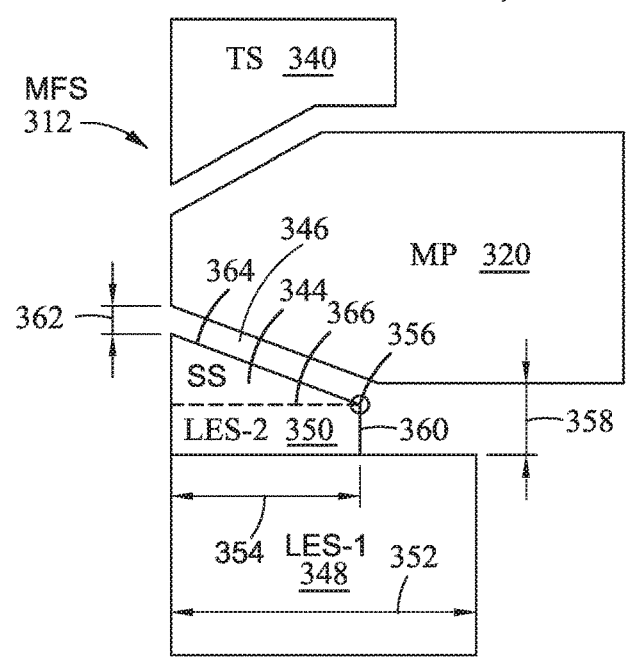
Fig. 3A
Fig. 3B
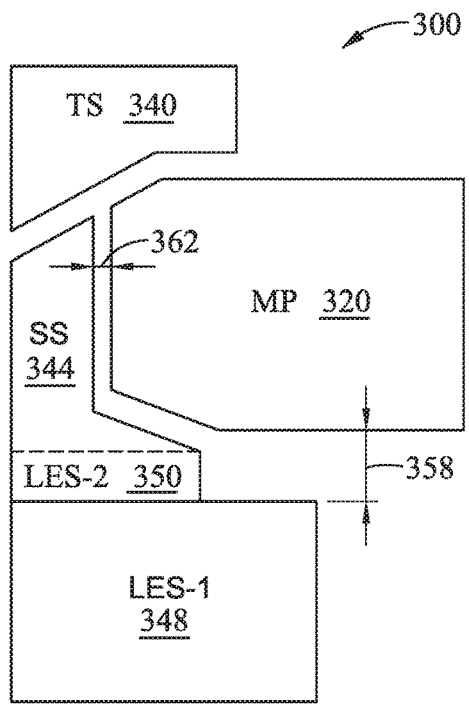
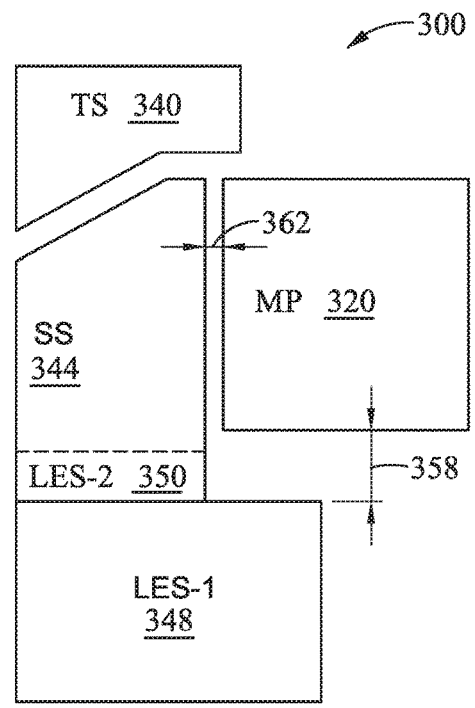
Fig. 3C
Fig. 3D

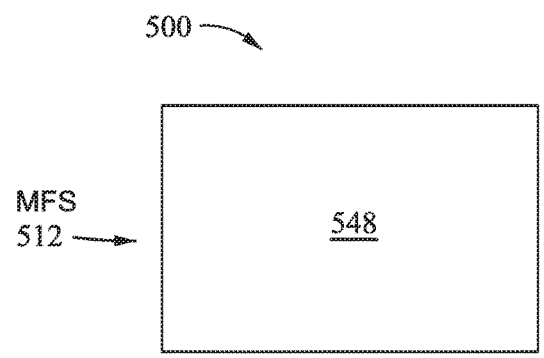
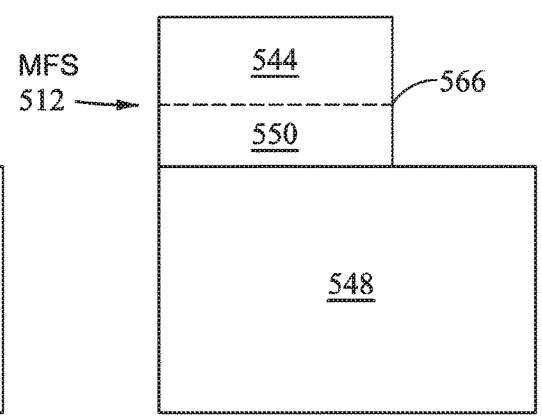
Fig. 5A    Fig. 5B
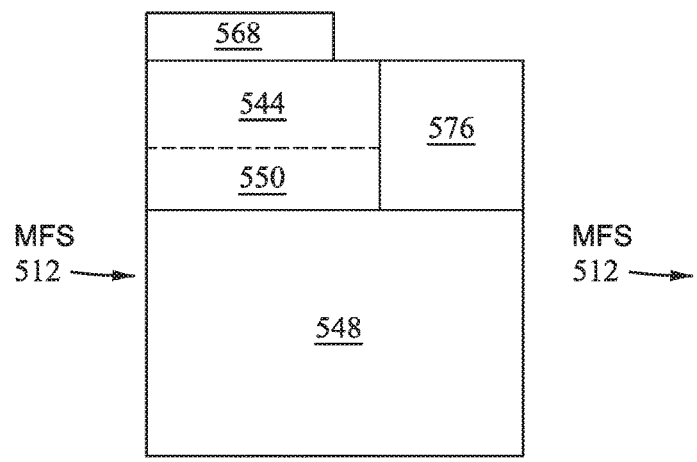
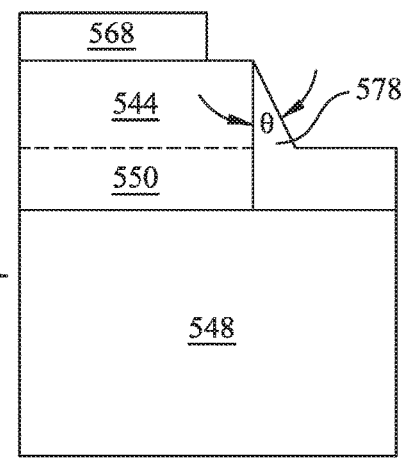
Fig. 5C    Fig. 5D

WRITE HEAD HAVING A MONOLITHIC SIDE SHEILD AND LEADING SHIELD

BACKGROUND OF THE DISCLOSURE

Field of the Disclosure

Embodiments of the present disclosure generally relate to data storage devices, and more specifically, to a magnetic media drive employing a write head.

Description of the Related Art

Over the past few years, various magnetic recording methods have been studied to improve the areal density of a magnetic media device, such as a hard disk drive (HDD). Write heads in HDDs can have a significant effect on the overall performance and reliability of the recording device. Write heads may be designed to achieve specific advantages, such as improved performance, but may consequently have a negative impact on other characteristics, such as decreased reliability.

For example, write heads having a short side shield throat height separating the main pole from the side shield may provide for better overwrite and soft error rate (SER), but may degrade far track interference (FTI) performance and adjacent track interference (ATI) performance (FTI and ATI collectively referred to as XTI). A longer leading shield throat height separating the main pole from the leading shield may control XTI performance, but may result in flux leakage from the main pole if the main pole and leading shield are too close. Additionally, due to the fabrication process of write heads, the side shield throat height and the leading shield throat height may be difficult to control, and as such, it can be difficult to make the side shield throat height and the leading shield throat height substantially similar. It can also be difficult to make the throat height of the side shield short. Thus, there is typically a trade-off in write heads to have either a short side throat height or a longer leading shield throat height.

Therefore, there is a need in the art for an improved write head design and method of write head fabrication.

SUMMARY OF THE DISCLOSURE

Embodiments of the present disclosure generally relate to data storage devices, and more specifically, to a magnetic media drive employing a write head. The write head comprises a main pole and a monolithic side shield. A first leading shield is disposed below the side shield, and a second leading shield is disposed between the first leading shield and the side shield. The first leading shield has a greater throat height than a throat height of the second leading shield. A side shield throat height extending from the main pole to the side shield is shorter than the first leading shield throat height extending from the main pole to the first leading shield. The varying throat heights between the main pole, the side shield, and the first leading shield allow for enhanced cross-track recording density and reduce flux leakage from the main pole.

In one embodiment, a write head comprises a main pole, a first leading shield disposed below the main pole, and a monolithic side shield disposed between the main pole and the first leading shield. The monolithic side shield comprises a second leading shield. The monolithic side shield is distinct from the first leading shield.

In another embodiment, a write head comprises a main pole, a side shield disposed below the main pole, and a first leading shield disposed below the side shield. The first leading shield has a first surface at a media facing surface and a second surface opposite the first surface. A throat height of the first leading shield extends from the first surface to the second surface of the first leading shield. A second leading shield is disposed between the side shield and the first leading shield. The second leading shield has a first surface at the media facing surface and a second surface opposite the first surface. A throat height of the second leading shield extends from the first surface of the second leading shield to the second surface of the second leading shield. The throat height of the first leading shield is greater than the throat height of the second leading shield.

In another yet embodiment, a method of forming a write head comprises means for forming a first leading shield, means for simultaneously forming a second leading shield and a side shield on the first leading shield, means for forming a self-aligned leading edge taper, and means for forming a main pole after the formation of the first leading shield, the second leading shield, and the side shield.

In another embodiment, a write head comprises a main pole, a side shield disposed below the main pole, a first leading shield disposed below the side shield, and a side gap disposed between the main pole, the side shield, and the first leading shield. The side gap has a first portion extending from the main pole to the side shield having a first width, and a second portion extending from the main pole to the first leading shield having a second width, wherein the second width is greater than the first width.

In one embodiment, a method of forming a write head comprises forming a first leading shield, forming, simultaneously, a second leading shield and a side shield on the first leading shield, wherein the second leading shield is disposed on the first leading shield, and the side shield is disposed on the second leading shield, and forming a main pole.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3D illustrate various perspectives of a write head, according to one embodiment.

FIGS. 5A-5H illustrate a write head in various stages of fabrication, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to data storage devices, and more specifically, to a magnetic media drive employing a write head. The write head comprises a main pole and a monolithic side shield. A first leading shield is disposed below the side shield, and a second leading shield is disposed between the first leading shield and the side shield. The first leading shield has a greater throat height than a throat height of the second leading shield. A side shield throat height extending from the main pole to the side shield is shorter than the first leading shield throat height extending from the main pole to the first leading shield. The varying throat heights between the main pole, the side shield, and the first leading shield allow for enhanced cross-track recording density and reduce flux leakage from the main pole.

Figure 1:
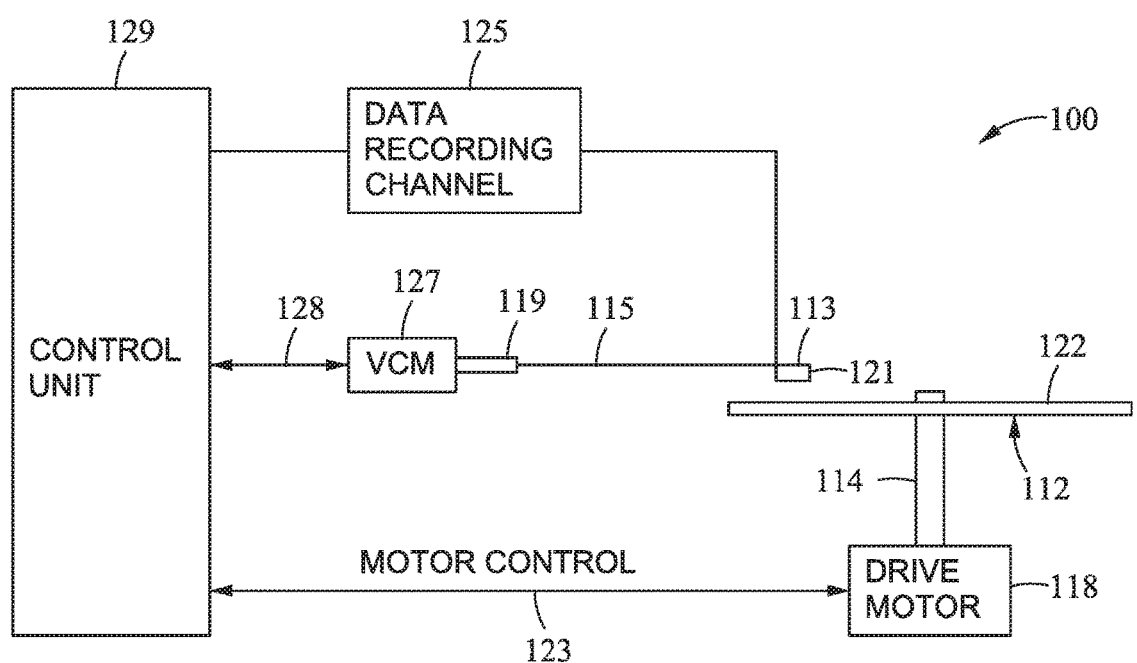
FIG. 1 illustrates a disk drive embodying this disclosure.

FIG. 1 illustrates a disk drive 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the media surface 122 which exerts an upward force or lift on the slider 113. The air bearing thus counterbalances the slight spring force of suspension 115 and supports slider 113 off and slightly above the media 112 surface by a small, substantially constant spacing during normal operation. The AC magnetic field generated from the magnetic head assembly 121 lowers the coercivity of the high-coercivity media so that the write elements of the magnetic head assemblies 121 may correctly magnetize the data bits in the media 112.

The various components of the disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
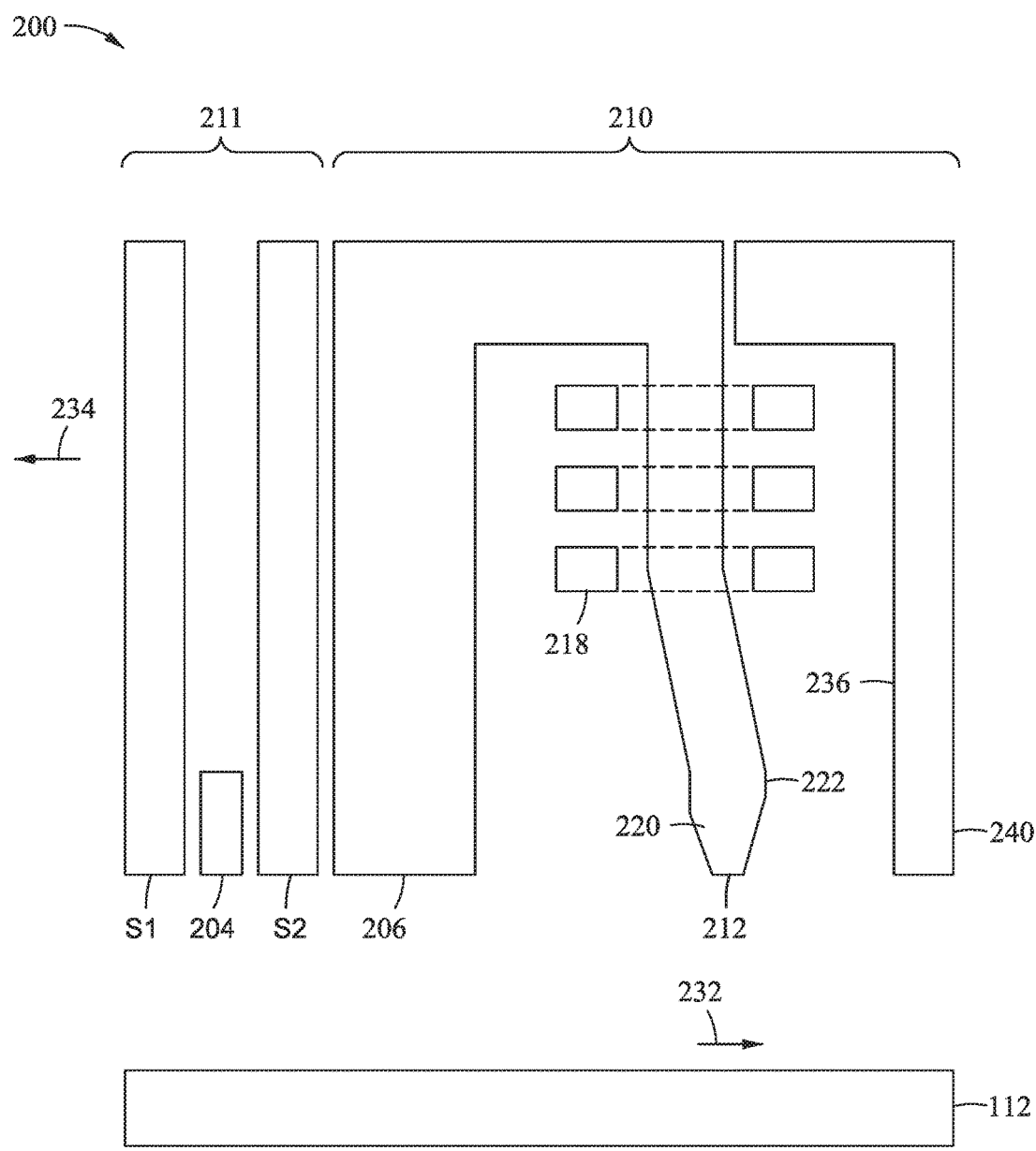
FIG. 2 is a fragmented, cross sectional side view through the center of a read/write head facing the magnetic media.

FIG. 2 is a fragmented, cross sectional side view through the center of a read/write head 200 facing the magnetic media 112. The read/write head 200 may correspond to the magnetic head assembly 121 described in FIG. 1. The read/write head 200 includes a media facing surface (MFS) 212, such as an air bearing surface (ABS), a magnetic write head 210, and a magnetic read head 211, and is mounted such that the MFS 212 is facing the magnetic media 112. In FIG. 2, the magnetic media 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap. A recording magnetic field is generated from the main pole 220 and the trailing shield 240 helps making the magnetic field gradient of the main pole 220 steep. The main pole 220 may be a magnetic material such as an FeCo alloy. The main pole 220 may include a trailing surface 222 which may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 T and a thickness of about 300 nanometers (nm). The trailing shield 240 may be a magnetic material such as NiFe alloy. In one embodiment, the trailing shield 240 has an Ms of about 1.2 T.

FIG. 3A is a fragmented, MFS view of a write head 300 according to one embodiment. FIGS. 3B-3D are cross-sectional views of the write head 300 according to one embodiment. Specifically, FIG. 3B shows a cross-sectional view of the write head 300, FIG. 3C shows a slightly off-center cross-sectional view of the write head 300, and FIG. 3D shows an off-center cross-sectional view of the write head 300. The write head 300 may be the write head 210 of FIG. 2. The write head 300 includes a main pole 320 and a trailing shield 340. The main pole 320 may be the main pole 220 of FIG. 2, and the trailing shield 340 may be the trailing shield 240 of FIG. 2.

As shown in FIG. 3A viewed from the MFS, the trailing shield 340 is disposed above the main pole 320. A trailing gap 342 is disposed between the main pole 320 and the trailing shield 340. The main pole 320 is surrounded on three sides by a monolithic side shield 344. A leading gap 346 and side gaps 345 are disposed between the main pole 320 and the side shield 344. The leading gap 346 extends from an edge or bottom of the main pole to an end or top surface of the side shield 344 or to an edge or top surface or the second leading shield 350. The leading gap 346 is the vertical distance between the bottom of the main pole 320 to the nearest adjacent shield. Similarly, the side gaps 345 extends from an edge or bottom of the main pole to an end or top surface of the side shield 344 or to an edge or top surface or the second leading shield 350. The side gap 345 is a horizontal distance between the main pole 320 and the adjacent side shield 344. The leading gap 346 may be interchangeably referred to as a side gap 345. A first leading shield 348 is disposed below the side shield 344. A second leading shield 350, or a partial leading shield, is in contact with and disposed between the first leading shield 348 and the side shield 344. In one embodiment, the leading gap 346, the side gaps 345, and the trailing gap 342 are filled with an insulating material, such as alumina.

As shown in FIG. 3B, the first leading shield 348 has a first throat height 352 extending from a first surface disposed at the MFS 312 to a surface opposite the MFS 312, and the second leading shield has a second throat height 354 extending from a first surface disposed at the MFS 312 to a second surface 360 opposite the MFS. The first throat height 352 of the first leading shield 348 is greater than the second throat height 354 of the second leading shield 350. In one embodiment, the second surface 360 of the second leading shield 350 is aligned with a taper of the main pole 320. The second throat height 354 of the second leading shield 350 is substantially equal to a throat height of the side shield 344.

The side shield 344 extends the entire second throat height 354 of the second leading shield 350 to a point 356. The side shield 344 has a first surface disposed at the MFS 312 that is opposite the point 356. A second surface 364 of the side shield 344 connects the first surface of the side shield 344 disposed at the MFS to the point 356. The point 356 of the side shield 344 is aligned with the second surface 360 opposite the MFS of the second leading shield 350. The second surface 364 of the side shield 344 forms an obtuse angle at the point 356 with the second surface 360 of the second leading shield 350. The second surface 364 of the side shield 344 extending to the nearest, or bottom, surface of the main pole defines a first portion 362 of the leading gap 346.

The side shield 344 and the second leading shield 350 are formed in the same formation step, as described in detail in FIGS. 5A-5H. Forming the side shield 344 and the second leading shield 350 during the same formation step eliminates a material boundary or seam from separating the side shield 344 and the second leading shield 350, as denoted by the dotted line 366 in FIG. 3B. The dotted line 366 only represents the distinction between the side shield 344 and the second leading shield 350, and is not present in the write head 300 as a seam or material boundary.

Moreover, having a write head 300 with a first leading shield 348 and a second leading shield 350 having different throat heights 352, 354 allows the leading gap 346 to vary in size. As shown in FIG. 3B, the first portion 362 of the leading gap 346 disposed between the side shield 344 and the main pole 320 has a smaller width than the second portion 358 of the leading gap 346 disposed between the first leading shield 348 and the main pole 320. The second portion 358 of the leading gap 346 extends from a top surface of the first leading shield 348 to the nearest, or bottom, surface of the main pole 320. Additionally, as shown in FIG. 3C and FIG. 3D, the first portion 362 of the leading gap 346 and the second portion 358 of the leading gap 346 remain different widths or heights when viewed from various cross-sectional angles. In one embodiment, the first portion 362 of the leading gap 346 is less than 100 nm, and the second portion 358 of the leading gap 346 is greater than 150 nm.

The write head 300 having a shorter or thinner first portion 362 of the leading gap 346 improves the SER, ATI, and off-track performance of the write head 300. Having a longer or wider second portion 358 of the leading gap 346 reduces flux leakage from the main pole 320 into the first leading shield 348. The write head 300 having a thinner side shield 344 improves overwrite. Additionally, eliminating the material boundary or seam between the side shield 344 and the second leading shield 350 reduces the risk of XTI induced by materials and geometry boundaries.

Figure 4:
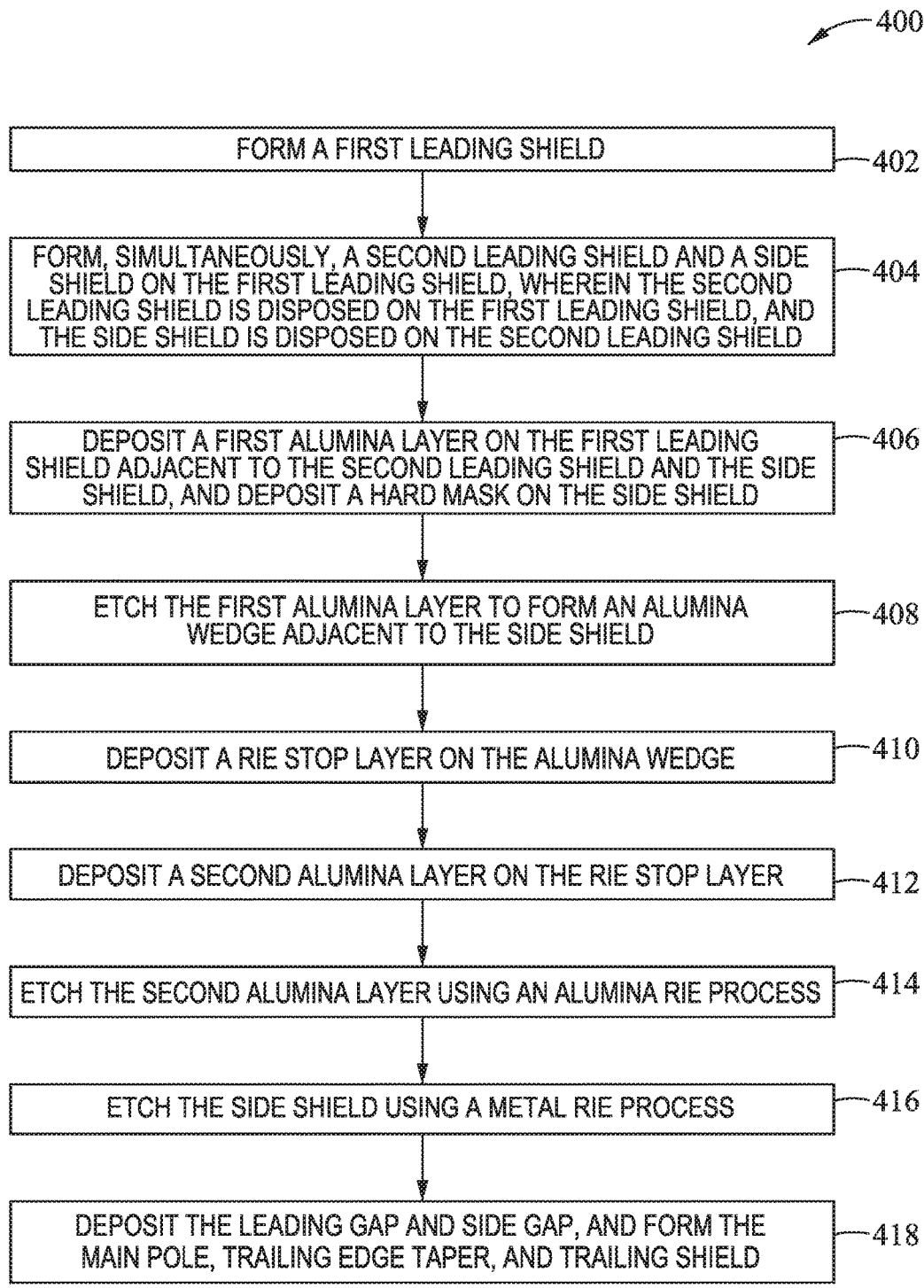
FIG. 4 illustrates a method of fabricating a write head, according to one embodiment.

FIG. 4 illustrates a method 400 of fabricating a write head, according to one embodiment. The method 400 may be used to fabricate the write head 300 in FIGS. 3A-3D. Additionally, the fabrication method 400 is partially demonstrated by FIGS. 5A-5H. FIGS. 5A-5H illustrate a write head 500 in various stages of fabrication. FIGS. 5A-5H illustrate a cross-sectional view of the write head 500 having an MFS 512. While the MFS 512 is illustrated, the write head fabrication stages demonstrated in FIGS. 5A-5H may occur prior to the formation of the MFS 512. For purposes of explanation, some aspects of FIG. 4 and FIGS. 5A-5H will be explained together.

In operation 402, a first leading shield 548 is formed, as shown in FIG. 5A. The formation of the first leading shield 548 of operation 402 may include steps such as electroplating into a photolithography defined pattern, plating seed removal, alumina refill, and chemical mechanical planarization (CMP) to define the first leading shield 548. In one embodiment, the first leading shield 548 comprises an NiFe alloy or a soft magnetic material, such as NiFeCo or NiFeRe.

In operation 404, a second leading shield 550 and a monolithic side shield 544 are formed simultaneously. The second leading shield 550 is formed on the first leading shield 548, and the side shield 544 is formed on the second leading shield 550, as shown in FIG. 5B. Forming the second leading shield 550 and the side shield 544 simultaneously in operation 404 eliminates a material boundary from forming to separate the second leading shield 550 and the side shield 544, as shown by the dotted line 566 in FIG. 5B. The side shield 544 and the second leading shield 550 are formed such that the second leading shield 550 has a smaller throat height than the first leading shield 548. The dotted line 566 only represents the distinction between the side shield 544 and the second leading shield 550, and is not present in the write head 500 as a seam or material boundary. The side shield 544 may not be differentiated from the second leading shield 550 until the side shield 544 is etched in operation 416.

The formation of the second leading shield 550 and the side shield 544 of operation 404 may include steps such as electroplating into a photolithography defined pattern, plating seed removal, alumina refill, and CMP to define the second leading shield 550 and the side shield 544. The side shield 544 and the second leading shield 550 may be formed in the same photoresist patterning and plating process. In at least one implementation, the second leading shield 550 and the side shield 544 comprise the same material, such as an NiFe alloy or a soft magnetic material. In one embodiment, the first leading shield 548 and the second leading shield 550 comprise different materials. The first leading shield 548 may have a larger area than the second leading shield 550. The second leading shield 550 and the side shield 544 may comprise an NiFe alloy or a soft magnetic material, such as NiFeCo or NiFeRe.

In operation 406, a first alumina layer 576 is deposited on the first leading shield 548 adjacent to the second leading shield 550 and the side shield 544, and a hard mask 568 is deposited on the side shield 544 and second leading shield 550, as shown in FIG. 5C. The first alumina layer 576 may also be deposited adjacent to the first leading shield 548 (not shown). In one embodiment, the hard mask 568 may be deposited only on the side shield 544. The edge of the hard mask 568 may be recessed from the edge of the second leading shield 550 and the side shield 544. The hard mask 568 may comprise Ta/NiCr.

In operation 408, the first alumina layer 576 is etched to form an alumina wedge 578 adjacent to the side shield 544, as shown in FIG. 5D. In at least one implementation, the alumina etch is a directional reactive ion etch (RIE) process. Specifically, the RIE process may be a timed RIE process. The wedge 578 is not limited to a triangular shape, and may have trapezoidal shape. The first alumina layer 576 is etched to form the wedge 578 having an optimized internal angle θ so that a desired leading edge taper may be formed in operation 416. In one embodiment, the optimized internal angle θ of the wedge 578 is about 3-20 degrees with the side shield 544, with respect to vertical of plane. The internal angle θ of the wedge 578 may be selected to obtain a leading edge taper 570 of about 20-45 degrees, which allows the leading edge taper 570 to self-align to the throat of the second leading shield. The alumina RIE process may use $BCl_3/CF_4$ gas as an etchant.

Figure 5E:
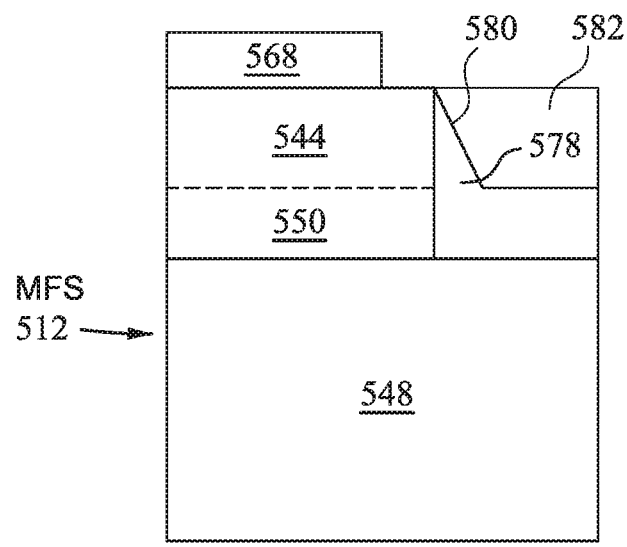

In operation 410, a RIE stop layer 580 is deposited on the alumina wedge 578, as shown in FIG. 5E. The RIE stop layer 580 may comprise NiCr or Cr. In operation 412, a second alumina layer 582 is deposited on the RIE stop layer 580, as further shown in FIG. 5E. The second alumina layer 582 may be planarized using CMP to obtain a substantially flat surface.

In operation 414, the second alumina layer 582 is etched. The second alumina layer 582 may be etched using a RIE process until the RIE stop layer 580 is reached. Gas comprising $BCl_3/CF_4$ may be used to etch the second alumina layer 582.

Figure 5F:
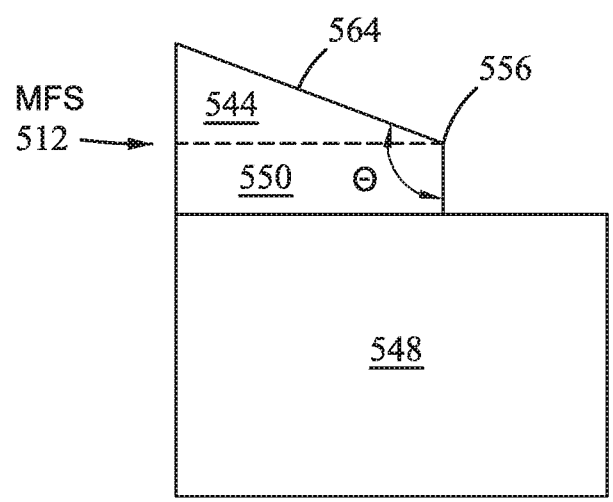

In operation 416, the side shield 544 is etched, as shown in FIG. 5F. The side shield 544 may be etched using a metal RIE process. Etching the side shield 544 may etch the hard mask 568 and the RIE stop layer 580 such that the hard mask 568 and the RIE stop layer 580 are removed. In the metal RIE process, $CH_3OH$ gas may be used as an etchant. After etching the side shield 544, the surface 564 of the side shield 544 and the second leading shield 550 converge to form an obtuse angle θ at a point 556 opposite the MFS 512. The desired angle of the surface 564 of the side shield 544 is achieved due to the optimized internal angle of the alumina wedge 578. In one embodiment, the second leading shield 550 is also etched to ensure that the side shield 544 and the second leading shield 550 are the same length, as shown in FIG. 5F.

Figure 5G:
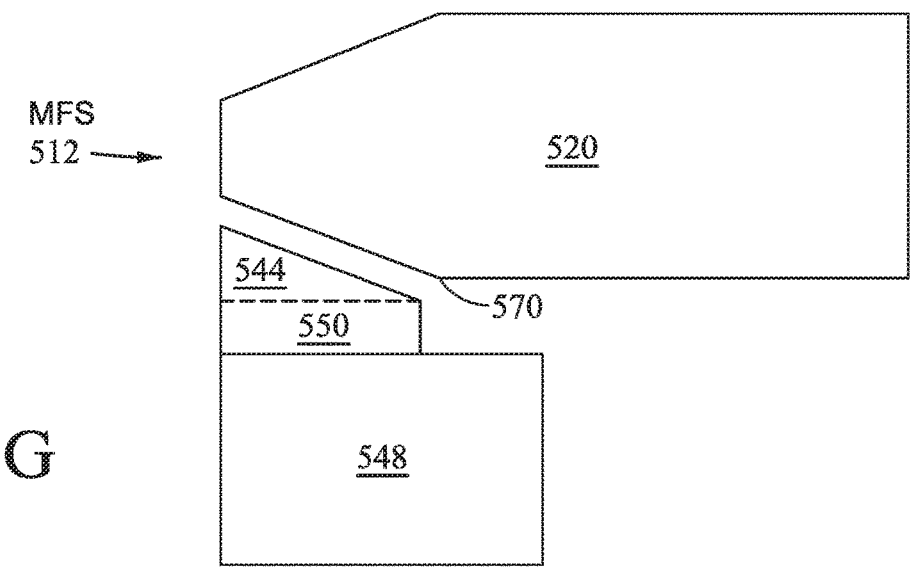
Figure 5H:
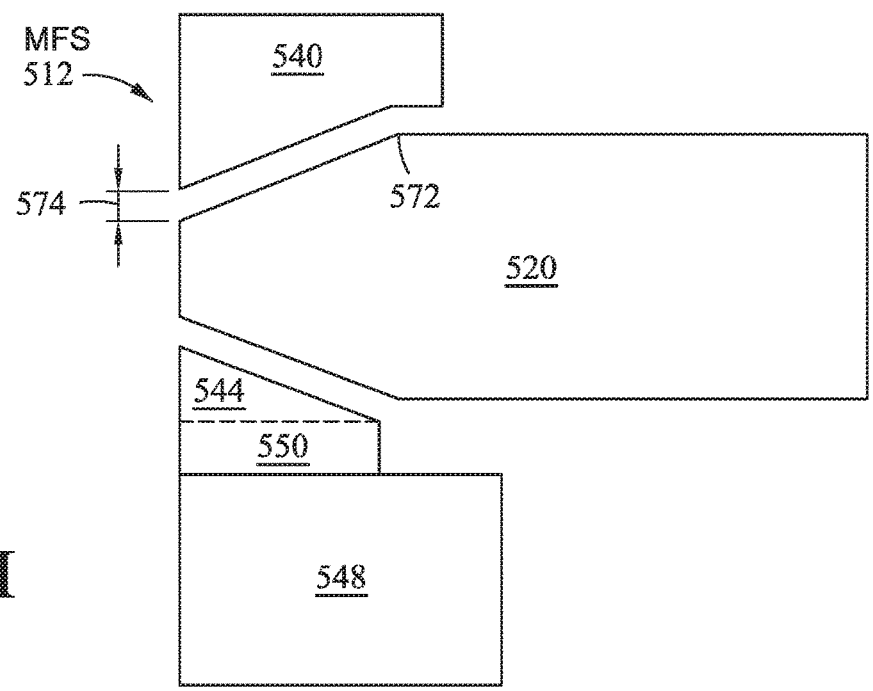

In operation 418, the leading gap and side gaps are deposited, and the main pole, trailing edge taper, and trailing shield are formed, as shown in FIGS. 5G-5H. Operation 418 may include forming a trench in the second leading shield 550 with a desired bevel angle, and forming a self-aligned leading edge taper 570 having a desired leading edge taper angle. In one embodiment, the angle at which the surface 564 of the side shield 544 is etched determines the angle of the leading edge taper 570, which allows the leading edge taper 570 to self-align.

The side gaps and leading gap may be comprised of NiCr, $Al_2O_3$, or NiCr. In one embodiment, the side gaps and leading gaps are an alumina layer deposited using atomic layer deposition (ALD). In another embodiment, the side gaps and leading gaps comprise a Ru layer deposited by chemical vapor deposition (CVD).

The main pole 520 may be formed by electroplating magnetic materials followed by CMP. The main pole 520 may comprise magnetic material such as an FeCo alloy. The main pole 520 is formed with the leading edge taper 570. The leading edge taper 570 may be aligned with the surface opposite the MFS 512 of the second leading shield 550 and the point 556 of the side shield 544. A write gap 574 may be disposed between the trailing edge taper 572 and the trailing shield 540.

Using fabrication method 400 to fabricate a write head results in the write head having a self-aligned leading edge taper, bevel angle, a desired main pole width and dimension control, and a uniform track width that is extendible to narrow dimensions. By first forming the first leading shield, the second leading shield, and the side shield prior to forming the main pole, better side shield throat control onto flat topography can be obtained, allowing for a narrow side shield throat to be achieved.

Furthermore, utilizing a monolithic side shield and a second leading shield having a short side shield throat height improves overwrite, SER, ATI, and off-track performance. Having a longer first leading shield throat height reduces flux leakage from the main pole into the first leading shield. By depositing the side shield and the second leading shield in the same deposition process, the material boundary or seam between the monolithic side shield and the second leading shield can be eliminated, reducing the risk of XTI induced by materials and geometry boundaries. Additionally, forming the first leading shield, second leading shield, and side shield prior to forming the main pole allows better side shield throat control while achieving an optimized bevel angle and leading edge taper angle. Overall, a write head having a short side shield throat height and a longer first leading shield throat height, as discussed above, results in a write head having enhanced performance and improved reliability.

In one embodiment, a write head comprises a main pole, a first leading shield disposed below the main pole, and a monolithic side shield disposed between the main pole and the first leading shield. The monolithic side shield comprises a second leading shield. The monolithic side shield is distinct from the first leading shield.

The monolithic side shield may comprise a material selected from the group consisting of NiFe, NiFeCo, and NiFeRe. The monolithic side shield may be spaced a first distance from the main pole, the first leading shield may be spaced a second distance from the main pole, and the first distance may be less than the second distance. The first distance may be a first portion of a leading gap disposed from the main pole to the side shield, and the second distance may be a second portion of the leading gap disposed from the main pole to the first leading shield. A data storage device may comprise the write head.

In another embodiment, a write head comprises a main pole, a side shield disposed below the main pole, and a first leading shield disposed below the side shield. The first leading shield has a first surface at a media facing surface and a second surface opposite the first surface. A throat height of the first leading shield extends from the first surface to the second surface of the first leading shield. A second leading shield is disposed between the side shield and the first leading shield. The second leading shield has a first surface at the media facing surface and a second surface opposite the first surface. A throat height of the second leading shield extends from the first surface of the second leading shield to the second surface of the second leading shield. The throat height of the first leading shield is greater than the throat height of the second leading shield.

The throat height of the second leading shield may be substantially equal to a throat height of the side shield. The second leading shield and the side shield may comprise the same material. The side shield and the second leading shield may be formed during a same photoresist patterning and plating process. The second surface opposite the media facing surface of the second leading shield may be aligned with a first taper of the main pole. A data storage device may comprise the write head.

In another yet embodiment, a method of forming a write head comprises forming a first leading shield, and simultaneously forming a second leading shield and a side shield on the first leading shield. The second leading shield is disposed on the first leading shield, and the side shield is disposed on the second leading shield. The method further comprises forming a main pole.

The side shield may comprise an NiFe alloy.

In another embodiment, a write head comprises a main pole, a side shield disposed below the main pole, a first leading shield disposed below the side shield, a second leading shield disposed between the first leading shield and the side shield, and a leading gap disposed between the main pole, the side shield, and the second leading shield. The leading gap has a first portion extending from the main pole to the side shield having a first width, and a second portion extending from the main pole to the second leading shield having a second width, wherein the second width is greater than the first width.

The first leading shield and the second leading shield may comprise different materials. The side shield is a monolithic side shield. A data storage device may comprise the write head.

In one embodiment, a method of forming a write head comprises forming a first leading shield, forming, simultaneously, a second leading shield and a side shield on the first leading shield, wherein the second leading shield is disposed on the first leading shield, and the side shield is disposed on the second leading shield, and forming a main pole.

The method may further comprise depositing a first alumina layer on the first leading may be deposited after forming the second leading shield and the side shield. The method may further comprise depositing a hard mask on the side shield, etching the first alumina layer to form an alumina wedge adjacent to the side shield, and etching the side shield prior to forming the main pole. The method may further comprise depositing an etch stop layer on the wedge prior to etching the side shield. The method may further comprise depositing a second alumina layer on the etch stop layer prior to etching the side shield. The method may further comprise planarizing the second alumina layer to obtain a substantially flat surface. The method may further comprise etching the second alumina layer prior to etching the side shield. The method may further comprise depositing a side gap and a leading gap after etching the side shield and prior to forming the main pole. A first portion of the leading gap disposed between the first leading shield and the main pole may have a greater width than a second portion of the leading gap disposed between the side shield and the main pole.

The alumina wedge may form an internal angle of about 3-20 degrees with the side shield. Etching the side shield may form a leading edge taper angle and creates a track width. The internal angle of the alumina wedge may be selected to obtain the leading edge taper angle of about 20-45 degrees. The second leading shield and the side shield may comprise the same material. The first leading shield may have a larger throat height than the second leading shield. The second leading shield may have a throat height substantially equal to a throat height of the side shield. The alumina wedge may have a trapezoidal shape. The alumina wedge may have a triangular shape. Simultaneously forming the second leading shield and the side shield on the first leading shield may prevent a material boundary line from forming between the side shield and the second leading shield.

While the foregoing is directed to embodiments of the present disclosure, other and further embodiments of the disclosure may be devised without departing from the basic scope thereof, and the scope thereof is determined by the claims that follow.

What is claimed is:

1. A write head, comprising:
  a main pole;
  a trailing shield disposed above the main pole;
  a trailing gap disposed between and in contact with the main pole and the trailing shield;
  a first leading shield disposed below the main pole; and
  a monolithic side shield disposed between the main pole and the first leading shield, the monolithic side shield comprising a second leading shield, wherein the monolithic side shield is distinct from the first leading shield, and wherein the monolithic side shield surrounds a first surface, a second surface, and a third surface of the main pole, and the trailing gap and the trailing shield are adjacent to a fourth surface of the main pole.

2. The write head of claim 1, wherein the monolithic side shield comprises a material selected from the group consisting of NiFe, NiFeCo, and NiFeRe.

3. The write head of claim 1, wherein the monolithic side shield is spaced a first distance from the main pole, the first leading shield is spaced a second distance from the main pole, and the first distance is less than the second distance.

4. The write head of claim 3, wherein the first distance is a first portion of a leading gap disposed from the main pole to the side shield, and wherein the second distance is a second portion of the leading gap disposed from the main pole to the first leading shield.

5. A data storage device, comprising the write head of claim 1.

6. A write head, comprising:
  a main pole;
  a trailing shield disposed above the main pole;

a trailing gap disposed between and in contact with the main pole and the trailing shield, wherein the trailing gap and the trailing shield are adjacent to a first surface of the main pole;

a side shield surrounding a second surface, a third surface, and a fourth surface of the main pole;

a first leading shield disposed below the side shield, the first leading shield having a first surface at a media facing surface and a second surface opposite the first surface, wherein a throat height of the first leading shield extends from the first surface to the second surface of the first leading shield; and a second leading shield disposed between the side shield and the first leading shield, the second leading shield having a first surface at the media facing surface and a second surface opposite the first surface, wherein a throat height of the second leading shield extends from the first surface of the second leading shield to the second surface of the second leading shield, and wherein the throat height of the first leading shield is greater than the throat height of the second leading shield.

7. The write head of claim 6, wherein the throat height of the second leading shield is substantially equal to a throat height of the side shield.

8. The write head of claim 6, wherein the second leading shield and the side shield comprise the same material.

9. The write head of claim 6, wherein the side shield and the second leading shield are formed during a same photoresist patterning and plating process.

10. The write head of claim 6, wherein the second surface opposite the media facing surface of the second leading shield is aligned with a leading edge taper of the main pole.

11. A data storage device, comprising the write head of claim 6.

12. A method of forming a write head, comprising:
forming a first leading shield;
simultaneously forming a second leading shield and a side shield on the first leading shield, wherein forming the side shield comprises etching a first surface of the side shield to be angled, the first surface of the side shield being disposed opposite the second leading shield; and
forming a main pole after the formation of the first leading shield, the second leading shield, and the side shield, the main pole comprising a self-aligned leading edge taper, wherein an angle of the self-aligned leading edge taper is determined by the angle of the first surface of the side shield.

13. The method of claim 12, wherein the side shield comprises an NiFe alloy.

14. A write head, comprising:
a main pole;
a trailing shield disposed above the main pole;
a trailing gap disposed between and in contact with the main pole and the trailing shield, wherein the trailing gap and the trailing shield are adjacent to a first surface of the main pole;
a side shield surrounding a second surface, a third surface, and a fourth surface of the main pole;
a first leading shield disposed below the side shield;
a second leading shield disposed between the first leading shield and the side shield; and
a leading gap disposed between the main pole, the side shield, and the second leading shield, wherein the leading gap has a first portion extending from the main pole to the side shield having a first width, and a second portion extending from the main pole to the first leading shield having a second width, wherein the second width is greater than the first width.

15. The write head of claim 14, wherein the first leading shield and the second leading shield comprise different materials.

16. The write head of claim 14, wherein the side shield is a monolithic side shield.

17. A data storage device, comprising the write head of claim 14.

18. A method of forming a write head, comprising:
forming a first leading shield;
forming, simultaneously, a second leading shield and a side shield on the first leading shield, wherein the second leading shield is disposed on the first leading shield, and the side shield is disposed on the second leading shield; and
forming a main pole after forming the second leading shield and the side shield, wherein simultaneously forming the second leading shield and the side shield on the first leading shield prevents a material boundary line from forming between the side shield and the second leading shield.

19. A method of forming a write head, comprising:
forming a first leading shield;
forming, simultaneously, a second leading shield and a side shield on the first leading shield, wherein the second leading shield is disposed on the first leading shield, and the side shield is disposed on the second leading shield;
forming a main pole;
depositing a first alumina layer on the first leading shield, the second leading shield, and the side shield, wherein the first alumina layer is deposited after forming the second leading shield and the side shield;
depositing a hard mask on the side shield;
etching the first alumina layer to form an alumina wedge adjacent to the side shield; and
etching the side shield prior to forming the main pole.

20. The method of claim 19, further comprising depositing an etch stop layer on the wedge prior to etching the side shield.

21. The method of claim 20, further comprising depositing a second alumina layer on the etch stop layer prior to etching the side shield.

22. The method of claim 21, further comprising planarizing the second alumina layer to obtain a substantially flat surface.

23. The method of claim 22, further comprising etching the second alumina layer prior to etching the side shield.

24. The method of claim 23, further comprising depositing a side gap and a leading gap after etching the side shield and prior to forming the main pole.

25. The method of claim 24, wherein a first portion of the leading gap disposed between the first leading shield and the main pole has a greater width than a second portion of the leading gap disposed between the side shield and the main pole.

26. The method of claim 19, wherein the alumina wedge forms an internal angle of about 3-20 degrees with the side shield.

27. The method of claim 26, wherein etching the side shield forms a leading edge taper angle and creates a track width.

28. The method of claim 27, wherein the internal angle of the alumina wedge is selected to obtain the leading edge taper angle of about 20-45 degrees.

29. The method of claim 19, wherein the second leading shield and the side shield comprise the same material.

30. The method of claim 19, wherein the first leading shield has a larger throat height than the second leading shield, and wherein the second leading shield has a throat height substantially equal to a throat height of the side shield.

31. The method of claim 19, wherein the alumina wedge has a trapezoidal shape.

32. The method of claim 19, wherein the alumina wedge has a triangular shape.

* * * * *

UNITED STATES PATENT AND TRADEMARK OFFICE
CERTIFICATE OF CORRECTION

PATENT NO. : 10,468,054 B1
APPLICATION NO. : 16/109489
DATED : November 5, 2019
INVENTOR(S) : Kyusik Shin et al.

Page 1 of 1

It is certified that error appears in the above-identified patent and that said Letters Patent is hereby corrected as shown below:

On the Title Page

Item (54) and in the Specification, Column 1, Line 2, Please delete "SHEILD" and replace with "SHIELD"

Signed and Sealed this
Eleventh Day of February, 2020

Andrei Iancu
*Director of the United States Patent and Trademark Office*